Figure 1:
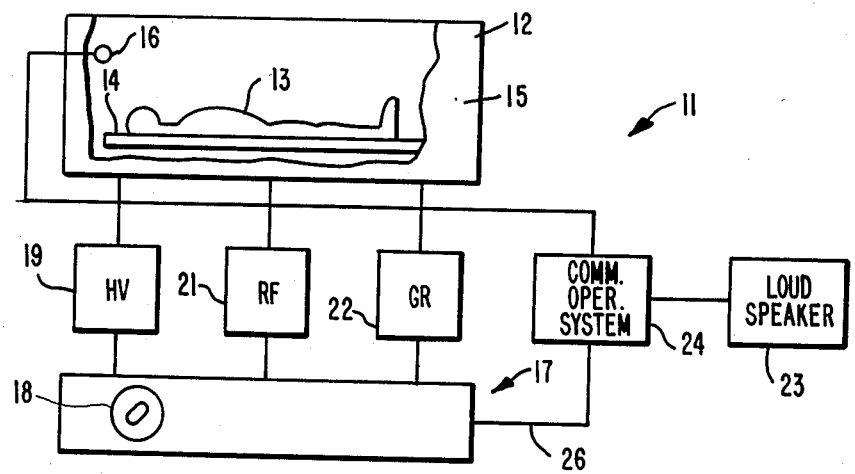

United States Patent [19]

Egozi

[11] Patent Number: 4,696,030
[45] Date of Patent: Sep. 22, 1987

[54] PATIENT OPERATOR INTERCOM ARRANGEMENTS FOR MAGNETIC RESONANCE IMAGING SYSTEMS

[75] Inventor: Avihay Egozi, Netanya, Israel
[73] Assignee: Elscint Ltd., Haifa, Israel
[21] Appl. No.: 809,248
[22] Filed: Dec. 16, 1987
[51] Int. Cl.$^4$ .................. H04M 9/00; H04B 15/00
[52] U.S. Cl. .................................. 379/167; 381/94
[58] Field of Search .............. 179/20 P, 37, 6.14; 381/94; 367/45, 46, 901; 364/421; 379/167

[56] References Cited

U.S. PATENT DOCUMENTS

| | | | |
|---|---|---|---|
| 2,553,410 | 5/1951 | Handschin | 179/6.14 |
| 3,611,279 | 10/1971 | Hensley | 367/46 |
| 3,644,674 | 2/1972 | Mitchell et al. | 381/94 |
| 3,700,812 | 10/1972 | Springett | 381/94 |
| 4,059,818 | 11/1977 | Kostelnicek | 367/46 |
| 4,104,611 | 8/1978 | Kalden | 367/46 |
| 4,315,319 | 2/1982 | White | 364/571 |
| 4,358,738 | 11/1982 | Kahn | 328/165 |
| 4,417,098 | 11/1983 | Chaplin et al. | 381/94 |
| 4,419,544 | 12/1983 | Adelman | 179/107 FD |
| 4,501,014 | 2/1985 | Blüthgen | 381/94 |
| 4,536,887 | 8/1985 | Kaneda et al. | 381/92 |
| 4,637,050 | 1/1987 | Schradin | 381/94 |

Primary Examiner—Gene Z. Rubinson
Assistant Examiner—M. E. Connors
Attorney, Agent, or Firm—Sandler & Greenblum

[57] ABSTRACT

A patient intercom arrangement for magnetic resonance imaging systems wherein the gradient noises are recorded and substracted from the voice plus noise signals received from the patient during scan procedures to provide clear and audible voice signals.

7 Claims, 3 Drawing Figures

PATIENT OPERATOR INTERCOM ARRANGEMENTS FOR MAGNETIC RESONANCE IMAGING SYSTEMS

FIELD OF THE INVENTION

This invention is concerned with magnetic resonant imaging (MRI) systems and more particularly with patient-operator intercommunication arrangements used with such systems.

BACKGROUND OF THE INVENTION

The suppliers and operators of MRI systems are continuously trying to make such system "patient friendly". More particularly arrangements are used wherever possible to alleviate any claustrophobic effects of the tunnel or bore of the magnet on the patient. Thus, for example reflecting arrangements are known which use mirrors to provide an outside view to the patient while in the bore or tunnel of the magnet. Similarly, more and more such MRI systems include intercommunication systems enabling the patient to communicate with people conducting the tests. Such communications not only ease the patients' apprehensions and makes them more comfortable; but also, are useful to give last minute instructions to the patients or to receive and answer any questions the patient may have during the scan.

Anybody who has undergone an MRI scan procedure is aware that the gradient field pulses generate loud banging like noises which occur repetitively, i.e. each time a gradient pulse is applied. These noises interfere with the communications between the patient and system operator. In fact the patient's voice is largely drowned out by the gradient noises effectively destroying the beneficial effects of such intercom arrangements.

Accordingly, it is a goal for the suppliers of such systems to enhance the effectiveness of the intercom arrangements by eliminating or minimizing the interference caused by the gradient noises during times that the patient is speaking to the operator.

Accordingly, an object of the present invention is to provide intercom arrangements wherein the gradient noises interferences is largely eliminated in the patient-operator intercom arrangement.

BRIEF DESCRIPTION OF THE INVENTION

According to a preferred general aspect of the present invention a patient intercom arrangement for MRI systems is provided. The inventive intercom arrangement substantially eliminates gradient noise interference with the patient-operator intercommunication, said arrangement comprising:

microphone means in the vicinity of the patient for converting audio signals into electrical signals, loud-speaker means in the vicinity of the operator for converting the electrical signals to audio signals, operating circuit means coupling said microphone means to said loud speaker means, and said operating circuit means including means for cancelling repetitive noises to thereby substantially eliminate said gradient noises.

A feature of the present invention includes utilization of a "smart" filter arrangement for use in substantially eliminating the gradient signal caused noises.

A further feature of the invention enables a determination of repetitive noises and the elimination of such determined repetitive noises without interferring with random patient voice signals.

Yet another feature of the invention enables storing gradient noises occuring during a scan and using the stored gradient noises to cancel gradient noises that may occur while the patient is using the intercom arrangement.

Means are provided for "purifying" the stored gradient noises, i.e., ideally the stored noises are pure gradient noises uncontaminated by voice signals.

Still another related feature of the invention comprises the utilization of means for refreshing the stored "pure" gradient noises.

A still further feature of the invention enables determination of random noises that are intermixed with the repetitive gradient noises and means for discarding the random sound from the storage while retaining the "pure" noise signals in storage. The "pure" noise signals are subtracted from the combined noise and voice signals to obtain the voice signals without noise or interference.

Accordingly in a broad aspect of the invention, two memory units are used. One is designated memory A and the other designated as memory B. The memory units are used for storing microphone generated signals from the bore. Means are provided for distinquishing "pure" noise signals from noise pulse voice signals. In a preferred embodiment the "pure" noise signals are distinguished by the fact that they are substantially repetitive while the voice signals are random. The A memory has the repetitive noises stored therein. The contents of the A memory are compared to a newly received communication from the patient in the bore of the magnet.

The stored noises are subtracted from the newly received communications to provide first subtracted signals. These first subtracted signals are amplified and transmitted to the loud speaker for obtaining the patient's voice communication without the gradient noise.

At the same time the B memory is constantly refreshed with the incoming communications from the bore of the magnet. At the next cycle of the scan procedure the contents of the B memory are also subtracted from the newly received signals to obtain second subtracted signals. The first subtracted signals and the second subtracted signals are each compared to a threshold. The number of times each of the subtracted signals exceeds the threshold is counted. The memory A or B that provides the subtracted lower count is connected for use in subtracting the gradient noise from the newly received communication from the bore of the magnet. The memory with the higher count will be refreshed during the next cycle. Thus the memories are continuously refreshed and the memory with the "purest" noise signal is chosen as the "master", i.e., the memory whose contents are used in the subtraction process.

BRIEF DESCRIPTIONS OF THE DRAWINGS

Figure 3:
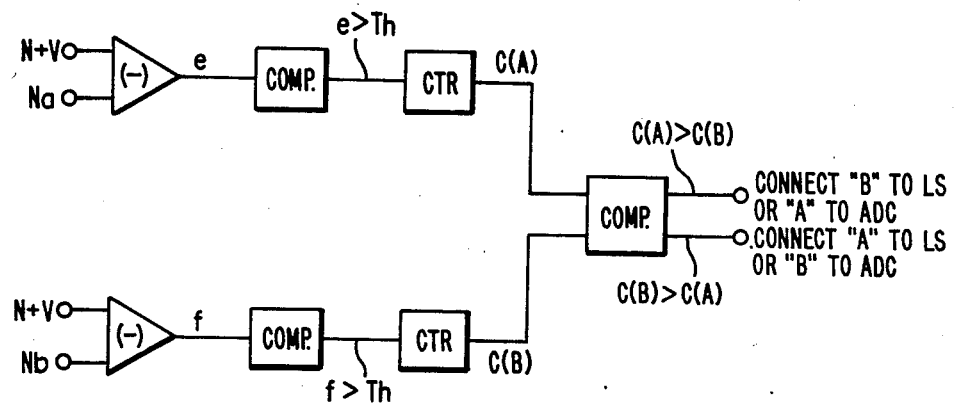
Figure 2:
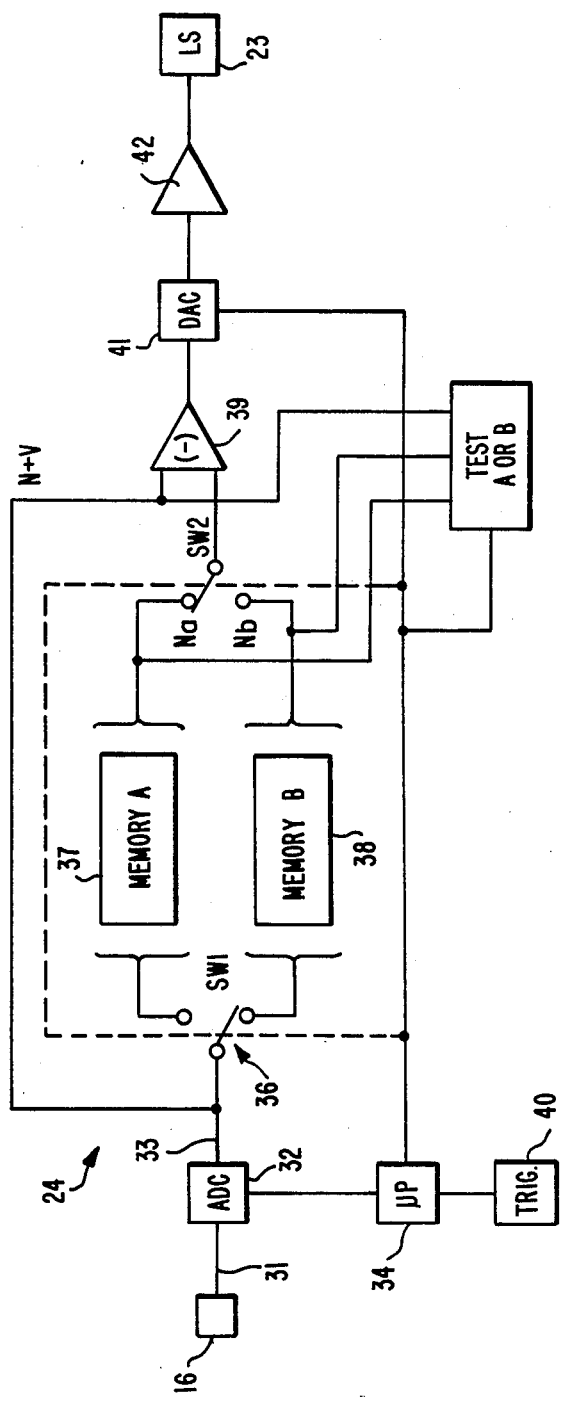

The above named and other features and objects of the invention will be best understood when considered in the light of the following description of the invention made in conjunction with the accompanying drawings, wherein:

FIG. 1 is a block diagram showing an MRI system including a patient operator communication arrangement, FIG. 2 is a block diagram showing of the patient operator intercommunication arrangement, and FIG. 3 in a more detailed block diagram showing of the "TEST" block of FIG. 2.

GENERAL DESCRIPTION

FIG. 1 at 11 shows a generalized MRI system. The system includes the magnet 12 with a patient 13 on the bed 14 in the bore 15 of the magnet. A microphone 16 is shown mounted in the vicinity of the patient. The MRI system includes a console 17 used by the operator for controlling the system. The console also includes the micro-processor equipment (not shown) that controls the data acquisition, as well as the data and image processing. The display means is shown at 18. A static magnetic field generator Ho is depicted at 19 while a radio frequency Rf generator is shown at 21. The gradient field generator is shown at 22.

It is well known that the generation of gradient fields also generates gradient noises. The noises are repetitive that is similar sounding noises are generated by each application of a gradient during a scan.

Connected in the vicinity of the operator and the console 17 is a loud speaker 23. The loud speaker is interconnected to the microphone through proper conductors and the communication operating system 24 which includes such things as amplifiers and gradient noise reducing means. A cable 26 is shown extending from the console 17 to the operating means of the intercom system to indicate the control of the operating means by the software and hardware in the microprocessor of the console.

FIG. 2 is a block diagram of the intercom system showing the microphone 16 and the operating system 24 in greater detail. More particularly in a preferred embodiment, the audio signals are converted by microphone 16 to analog electrical signals which appear on the conductor 31. Means such as analog to digital converter 32 may be used to convert the analog signals to digital signals which appear on conductor 33. The digital signals are shown connected to a select system 36 under the control of a microprocessor 34 located within the console 17. The microprocessor controls the select system 36 which is used to select between two memories; i.e., the A memory and the B memory 38.

Means are provided for using the repetitive characteristic of the noise signal for distinguishing the noise signal. More particularly trigger means 40 are shown connected to the controlprocessor 34. The trigger means starts the recording process at the same point per cycle. In a preferred embodiment the triggering event is the application of a new encoding gradient pulse.

Both memories are used to record the gradient noises. Two memories are used to provide fresh pure noise signals for use by the system. Fresh signals are preferred since the characteristics of the noise signals are extremely sensitive to environment changes in the system; this fresh signals more clearly reflect the actual present noises. More particularly the A and B memories are used to memorize the signals coming from the interior of the bore that have been picked up by the microphone 16. The recorded signals include gradient noises and voice signals. It is the pure gradient noises (devoid of voice signals) that the system ideally stores. However at the time a signal is stored, the patient may be talking. Thus, the voice signal may be intermixed with the gradient noises. This is undesirable since what is stored in the memory is subtracted from the received signal in difference circuit 39. Thus the voice signal would also be subtracted from the newly received intermixed voice and noise signals. The resulting difference signal will have not only reduced noise but also reduced useful voice signals.

Means are provided for preventing or at least inhibiting the reduction of voice signals during the subtraction process. More particularly the select apparatus and process chooses the memory having the least amount of voice signals. The contents of the selected A or B memory are subtracted from the newly received signal in the difference amplifier 39 to provide a first difference signal. The difference signal is transmitted under the control of the microprocessor 34 to a digital to analog converter 41 where the signal is converted to analog signals which are amplified by the amplifier 42. The amplified analog signals are converted to audio signals by loud speaker 23.

The selection of the memories A or B is indicated with switches SW1 and SW2. Thus in FIG. 2 the contents Na of memory A are subtracted from the newly received signal (indicated as N+V) to obtain the substantially pure unattenuated voice signal V. During the scan cycle, memory B is refilled with the signal from the bore of the magnet as indicated by switch SW1. A test circuit 44 is used to compare the contents of memories A and B and to select the memory whose contents when subtracted from the incoming signals will provide the best voice signals.

Details of the apparatus and operation of the memory select or test circuit 4 in a preferred embodiment, is shown in FIG. 3. The contents Na and Nb of both A and B memories are first subtracted from the newly acquired signals N+V in difference circuits 51 and 52 respectively. The difference e and f respectively are compared to a certain threshold value Th in comparator circuits 53 and 54, respectively. When the amplitude of the signals e and f are above the threshold Th then comparators 53 and 54 provide outputs. The outputs are shown labelled e>Th and f>Th. The outputs are counted in counter circuits 56 and 57 to obtain the counts C(A) and C(B) for the A and B memory signals respectively. The counts are compared in a comparison circuit 58. The signal with the lower count is determinative of which memory is going to be used as the "master" to provide the information for subtraction from the newly received signal N+V thereby enabling minimizing the gradient noises in the intercom system. Thus, the memory with the lower count information (less random voice signal) is selected by the comparator 58 output signal. The other memory is connected to collect new data for refreshing purposes.

In practice the patient is placed within the magnet bore and the intercom arrangement is switched to the on position. The static magnetic field 46 is swtiched on. The appropriate gradients are switched in combination with the operation of the Rf field generator 21. The Rf generator also may include a receiver or a separate receiver may be used within the scope of the invention. None-the-less, during the operation of the system the patient may communicate with the operator. Gradient noises are in effect determined by their repetitiveness. The patient voice signals which are random are not removed during the subtraction of the repetitive noises from the received intercom signals prior to sending the signals to operate the loud speaker. Thus, the intercom arrangement eliminates gradient noises and leaves the voice signals thereby vastly improving the patient-operator intercommunications during the actual MRI scans.

While the invention is described using a preferred embodiment it should be understood these preferred embodiment is described by way of example only and not as limitations of the scope of the invention.

What is claimed is:

1. A patient intercom arrangement for transmitting intercom signals in magnetic resonance imaging (MRI) systems and enabling a patient to speak to an operator during scan procedures that use gradient pulses, said intercom arrangement substantially eliminating gradient noise interference with intercom signals, said intercom arrangement comprising:

(a) microphone means in the vicinity of the patient for converting audio signals into electrical intercom signals;
   (b) loudspeaker means in the vicinity of the operator for converting the electrical intercom signals to audio signals;
   (c) operating circuit means coupling said microphone means to said loud speaker means;
   (d) said operating circuit means including means for substantially cancelling gradient noise caused signals transmitted to the loud speaker while leaving the voice signals substantially unaffected;
   (e) said means for substantially cancelling gradient noise caused signals comprising recording means for recording said electrical intercom signals;
   (f) difference means for subtracting the recorded intercom signals from newly generated intercom signals including patient voice caused signals and gradient noise caused signals;
   (g) said recording means including first and second memory means;
   (h) means for connecting said first memory means to selecting means for connecting either said first or said second memory means to said difference means for subtracting the recorded electrical intercom signals from the newly generated intercom signals;
   (i) said selecting means also connecting the other of either said first or said second memory means to receive the newly generated electrical intercom signals;
   (j) comparison means for determining the voice content of the recorded electrical intercom signals in the first memory means and in the second memory means for selecting between the first memory means and the second memory means to obtain the memory means with the lowest voice content for the next subtraction of the contents of the memory means from the newly generated electrical intercom signals; and
   (k) means for connecting the output of the difference means to supply electrical signals to the loudspeaker.

2. The patient intercom arrangement of claim 1 wherein said comparison means for selecting between said first memory means and said second memory means comprises:

first subtraction means operated responsive to the commencement of alternate scan cycles, for obtaining a first difference by subtracting the contents of the first memory means from the newly generated intercom signal,
   second subtraction means operated responsive to said commencement of the alternative scan cycles for obtaining a second difference by subtracting the contents of the second memory means from the newly generated intercom signal,
   first comparator means for comparing the first difference to a threshold,
   second comparator means for comparing the second difference to the threshold,
   first counter means for counting the number of times the first difference is greater than the threshold,
   second counter means for counting the number of times the second difference is greater than the threshold,
   means for determining which count is greater, and
   means for connecting the memory that provided the lowest count to provide signals for the difference means and the memory that provided the greatest count to receive the signals from the microphone.

3. The patient intercom arrangement of claim 2 including means for converting the microphone signals to digital signals and means for converting the digital signals from the memory that provided the lowest count to analog signals for operating the loud speaker.

4. The patient intercom arrangement of claim 1 wherein the means for recording comprises trigger means for using repetitive signals as the noise caused signals.

5. The patient intercom arrangement of claim 4 wherein said trigger means for using repetitive signals comprises means for starting the recording operation at the same point on each cycle of a magnetic resonance imaging scan.

6. The patient intercom arrangement of claim 5 wherein the said same point is the application of a new gradient encoding pulse.

7. The patient intercom arrangement of claim 1 wherein the recording means include means for obtaining pure gradient caused signals substantially devoid of patient voice caused signals.

* * * * *